(12) United States Patent
Zhang et al.

(10) Patent No.: US 11,402,881 B2
(45) Date of Patent: Aug. 2, 2022

(54) ELECTROMAGNETIC LEAKAGE PREVENTION DEVICE AND COMPONENT FIXING MEMBER

(71) Applicant: Fulian Precision Electronics (Tianjin) Co., LTD., Tianjin (CN)

(72) Inventors: Ya-Ni Zhang, Tianjin (CN); Han-Yu Li, New Taipei (TW); Cheng-He Li, Tianjin (CN); Wen-Hu Lu, Tianjin (CN)

(73) Assignee: Fulian Precision Electronics (Tianjin) Co., LTD., Tianjin (CN)

(*) Notice: Subject to any disclaimer, the term of this patent is extended or adjusted under 35 U.S.C. 154(b) by 0 days.

(21) Appl. No.: 17/083,025

(22) Filed: Oct. 28, 2020

(65) Prior Publication Data
US 2021/0405713 A1 Dec. 30, 2021

(30) Foreign Application Priority Data
Jun. 28, 2020 (CN) .......................... 202010601897.9

(51) Int. Cl.
*G06F 1/18* (2006.01)
*G11B 33/14* (2006.01)
*G11B 33/12* (2006.01)

(52) U.S. Cl.
CPC .............. *G06F 1/182* (2013.01); *G06F 1/187* (2013.01); *G11B 33/1493* (2013.01); *G11B 33/124* (2013.01)

(58) Field of Classification Search
CPC ..... G06F 1/182; G06F 1/187; G11B 33/1493; G11B 33/124
See application file for complete search history.

(56) References Cited

U.S. PATENT DOCUMENTS

| 7,303,170 | B2 * | 12/2007 | Fan | G11B 33/127 248/27.3 |
| 7,491,900 | B1 * | 2/2009 | Peets | H05K 9/0016 174/382 |
| 7,817,413 | B2 * | 10/2010 | Peng | G11B 33/121 361/679.33 |
| 8,248,775 | B2 * | 8/2012 | Zhang | G11B 33/124 361/679.01 |
| 2008/0043454 | A1 * | 2/2008 | Titus | H05K 7/1487 361/818 |
| 2009/0086421 | A1 * | 4/2009 | Olesiewicz | H05K 9/0016 361/679.33 |

(Continued)

FOREIGN PATENT DOCUMENTS

JP H07201163 A 8/1995

*Primary Examiner* — Nidhi Thaker
(74) *Attorney, Agent, or Firm* — ScienBiziP, P.C.

(57) ABSTRACT

An electromagnetic leakage prevention device includes a bottom surface, first side walls, second side walls, a first connecting portion, and a second connecting portion. The first side walls are coupled to a side of the bottom surface. The second side walls are coupled to a side of the bottom surface opposite the first side walls. The first connecting portion is coupled to ends of the first side walls away from the bottom surface. The second connecting portion is coupled to ends of the second side walls away from the bottom surface. A distance between the first side walls and the second side walls increases along a direction away from the bottom surface.

9 Claims, 6 Drawing Sheets

(56) References Cited

U.S. PATENT DOCUMENTS

| | | | |
|---|---|---|---|
| 2010/0266246 A1* | 10/2010 | van Haaster | G02B 6/4277 385/94 |
| 2010/0284145 A1 | 11/2010 | Kang | |
| 2010/0307990 A1* | 12/2010 | Li | G11B 33/124 211/26 |
| 2012/0162896 A1* | 6/2012 | Ye | G11B 33/128 361/679.33 |
| 2013/0163183 A1* | 6/2013 | Lin | G11B 33/1493 361/679.33 |
| 2014/0146463 A1* | 5/2014 | Hsieh | G06F 1/182 361/679.33 |
| 2014/0182923 A1* | 7/2014 | Gerken | H05K 9/00 174/355 |
| 2019/0027192 A1* | 1/2019 | Tanzer | G11B 33/1493 |

\* cited by examiner

ELECTROMAGNETIC LEAKAGE PREVENTION DEVICE AND COMPONENT FIXING MEMBER

FIELD

The subject matter herein generally relates to an electromagnetic leakage prevention device and a component fixing member.

BACKGROUND

The function of an electromagnetic leakage prevention device is to strengthen close contact between metal parts of a chassis and connect parts of the chassis into a metal cavity to contain electromagnetic radiation.

A server generally includes a plurality of externally pluggable hard disk modules. In the process of plugging and unplugging the hard disk modules, the electromagnetic leakage prevention device in the related art may scratch an outer surface of the hard disk modules, which may cause damage to the hard disk modules.

BRIEF DESCRIPTION OF THE DRAWINGS

Implementations of the present disclosure will now be described, by way of embodiments, with reference to the attached figures.

DETAILED DESCRIPTION

Figure 1:
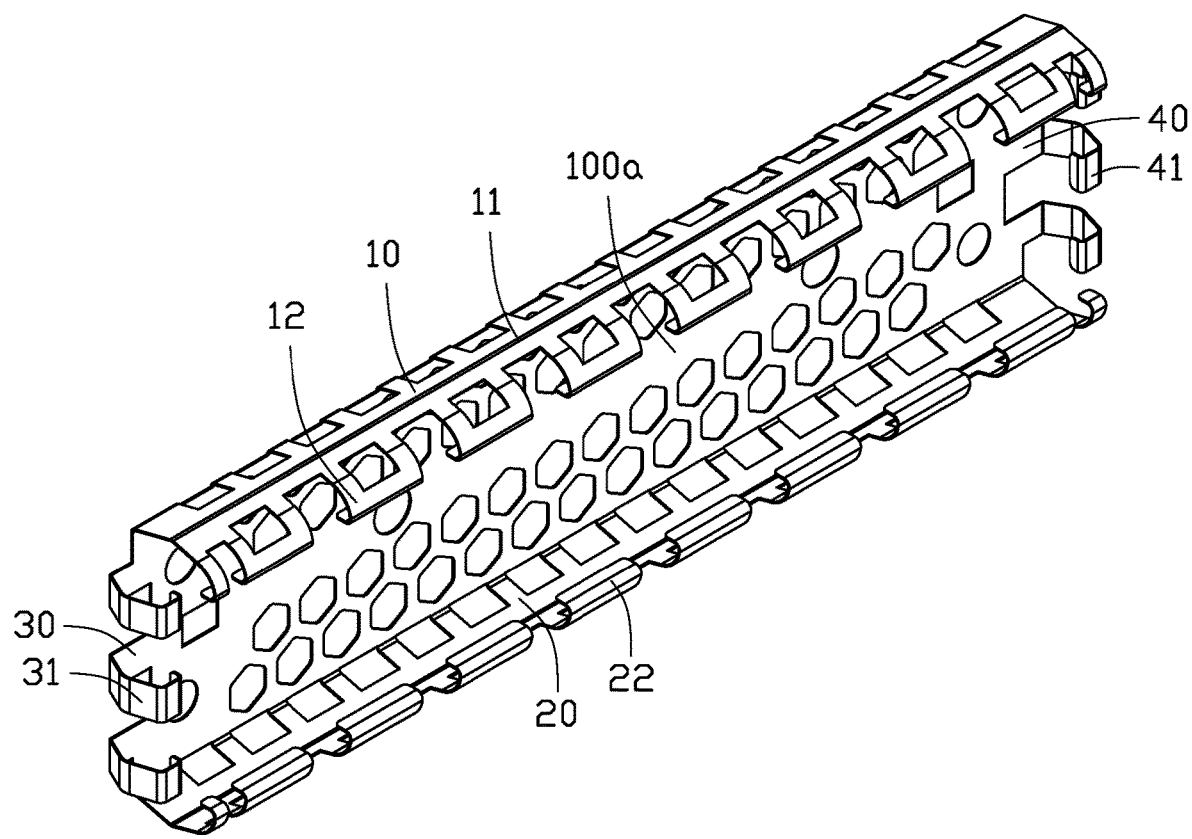
FIG. 1 is a schematic perspective view of an electromagnetic leakage prevention device according to an embodiment.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
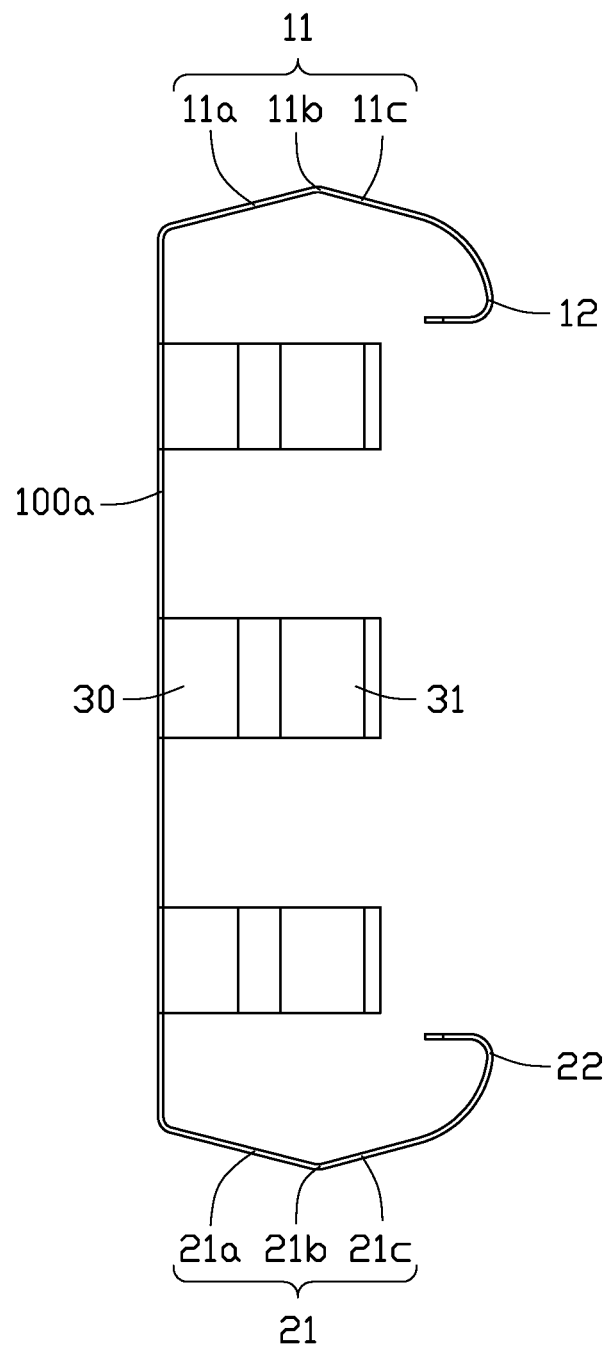
FIG. 2 is a side view of the electromagnetic leakage prevention device of FIG. 1.

FIG. 1 and FIG. 2 show an embodiment of an electromagnetic leakage prevention device 100 which can avoid scratching a component 200 (shown in FIG. 3) during a process of plugging and unplugging. The electromagnetic leakage prevention device 100 includes a bottom surface 100a, a plurality of first side walls 10, a plurality of second side walls 20, a first connecting portion 11, and a second connecting portion 21. The plurality of first side walls 10 and the plurality of second side walls 20 are respectively connected to opposite sides of the bottom surface 100a and spaced a distance from each other. A distance between the plurality of first side walls 10 and the plurality of second side walls 20 gradually increases in a direction away from the bottom surface 100a. The first connecting portion 11 is connected to ends of the plurality of first side walls 10 away from the bottom surface 100a. The first connecting portion 11 connects the first side walls 10 together. The second connecting portion 21 is connected to ends of the plurality of second side walls 20 away from the bottom surface 100a. The second connecting portion 21 connects the second side walls 20 together to prevent scratching the component 200.

Figure 3:
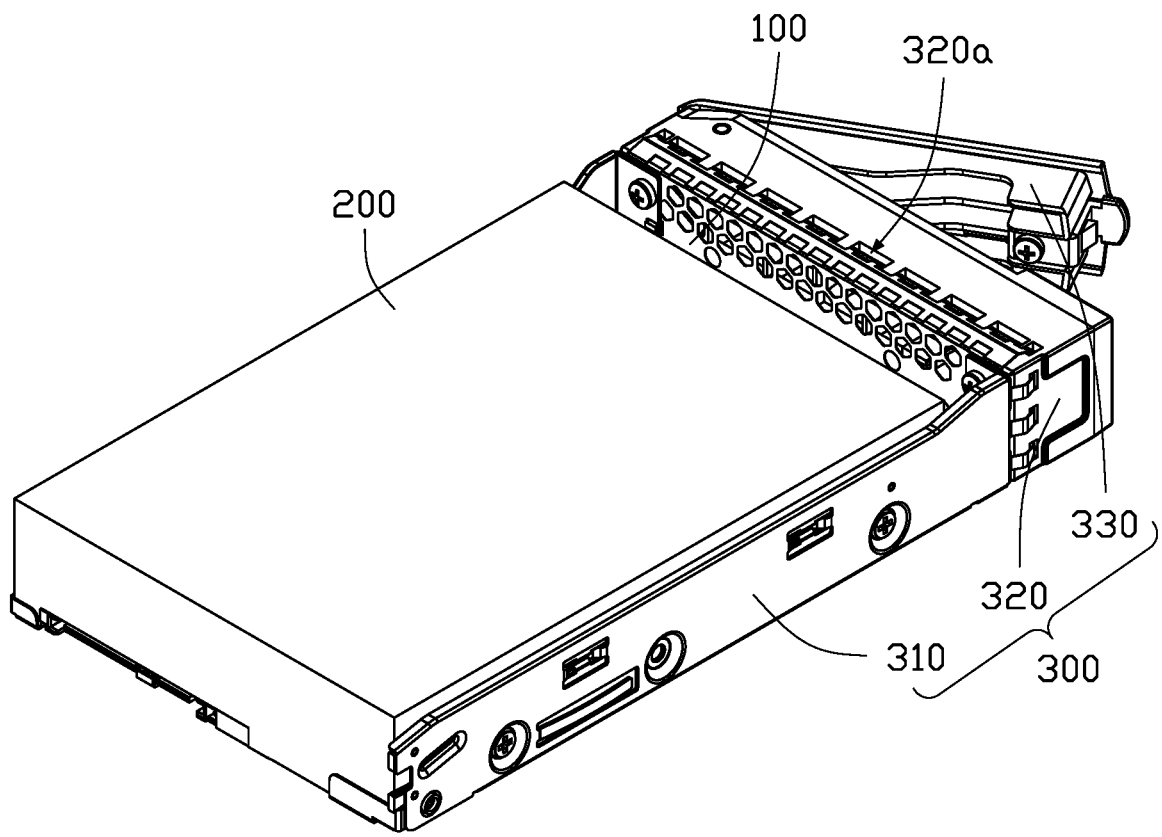
FIG. 3 is a perspective schematic view of the electromagnetic leakage prevention device and a component fixing member.

Referring to FIG. 3, the bottom surface 100a is substantially rectangular and configured to be fixed on a component fixing member 300. The first connecting portion 11 and the second connecting portion 21 are used to contact conductive objects (not shown) on opposite sides of the component fixing member 300 to form a conductive cavity to shield electromagnetic radiation. In one embodiment, the component 200 is a hard disk, and the component fixing member 300 is a hard disk fixing frame.

Figure 4:
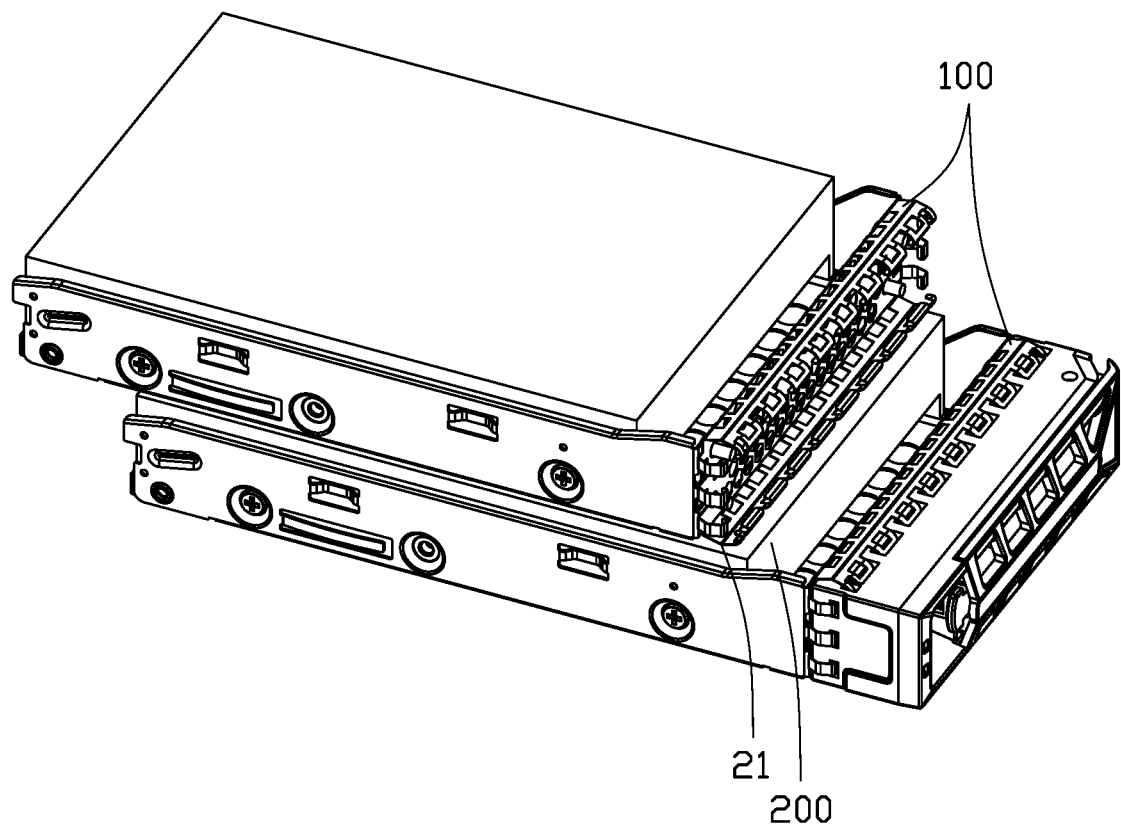
FIG. 4 is a perspective schematic view of a process of plugging and unplugging the component fixing member.

Referring to FIG. 4, in one embodiment, when a plurality of component fixing members 300 is stacked, adjacent first connecting portions 11 and second connecting portions 21 are in contact to conduct electricity. When changing the component fixing member 300, the integrated first connecting portion 11 and the second connecting portion 21 achieve the purpose of preventing scratching the component 200 during the insertion and removal process.

Referring to FIG. 2, in one embodiment, the first connecting portion 11 and the second connecting portion 21 are formed by bending the first side wall 10 and the second side wall 20, which can play a buffering role.

Figure 5:
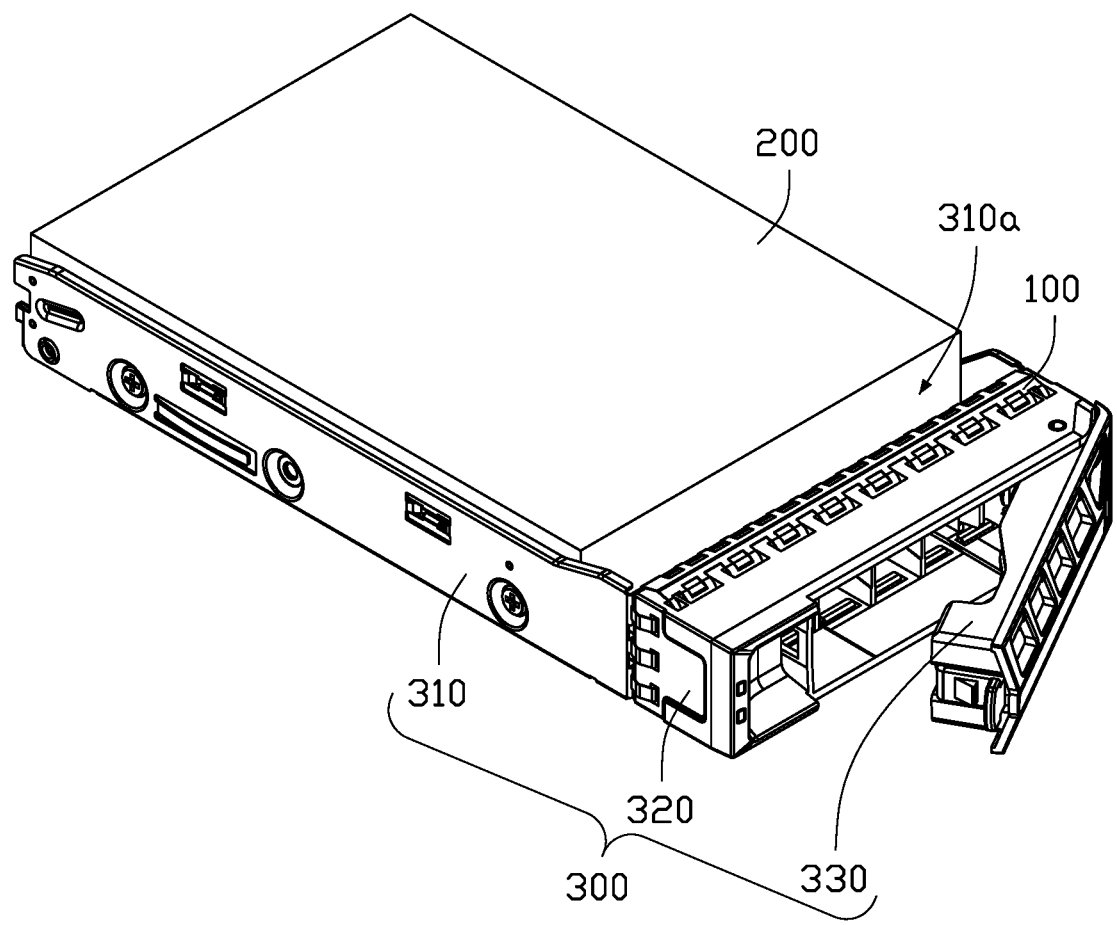
FIG. 5 is a perspective schematic view from another perspective of the electromagnetic leakage prevention device and the component fixing member in FIG. 3.

Referring to FIG. 2, FIG. 3, and FIG. 5, the ends of the first connecting portion 11 and the second connecting portion 21 away from the bottom surface 100a are respectively connected to a first holding portion 12 and a second holding portion 22. A distance between the first holding portion 12 and the second holding portion 22 along the direction away from the bottom surface 100a gradually decreases, and ends of the first holding portion 12 and the second holding portion 22 extend toward the bottom surface 100a. The first holding portion 12 and the second holding portion 22 are used to hold the component fixing member 300. In one embodiment, the first holding portion 12 and the second holding portion 22 are substantially hook-shaped. The component fixing member 300 includes a frame 310 and a fixing portion 320.

The electromagnetic leakage prevention device 100 is installed between the frame 310 and the fixing portion 320. The frame 310 defines a receiving cavity 310a for receiving a hard disk, and one end of the frame 310 is fixed to a side of the bottom surface 100a facing away from the first holding portion 12 and the second holding portion 22 by screws. The fixing portion 320 defines a plurality of insert slots 320a. Positions of the insert slots 320a correspond to the first holding portions 12 and the second holding portions 22. The insert slots 320a receive the first holding portions 12 and the second holding portions 22, so as to be fixedly connected to the electromagnetic leakage prevention device 100. A side of the fixing portion 320 facing away from the electromagnetic leakage prevention device 100 is provided with a handle 330 rotationally installed on the fixing portion 320 for assisting in replacing the component fixing member 300.

Referring to FIG. 1 and FIG. 2, the first connecting portion 11 includes a first connecting section 11a, a first arc section 11b, and a second connecting section 11c that are sequentially connected. The first connecting section 11a is connected to the plurality of first side walls 10. The second connecting section 11c is connected to the plurality of first holding portions 12. The first connecting section 11a and the second connecting section 11c are bent along the first arc section 11b.

Similarly, the second connecting portion 21 includes a third connecting section 21a, a second arc section 21b, and a fourth connecting section 21c that are sequentially connected. The third connecting section 21a is connected to the plurality of second side walls 20. The fourth connecting section 21c is connected to the plurality of second holding portions 22. The third connecting section 21a and the fourth connecting section 21c are bent along the second arc section 21b. The first arc section 11b and the second arc section 21b are beneficial for reducing friction and preventing scratching the component 200.

Figure 6:
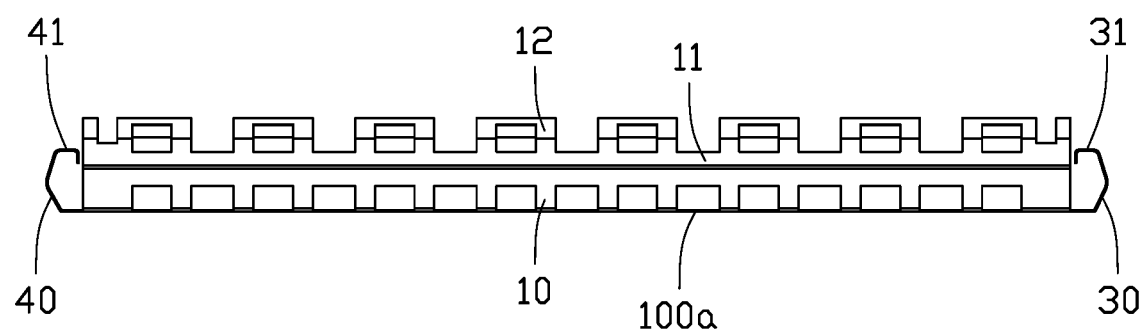
FIG. 6 is a top view of the electromagnetic leakage prevention device of FIG. 1.

Referring to FIG. 6, the electromagnetic leakage prevention device 100 further includes a plurality of third side walls 30 and a plurality of fourth side walls 40. The third side walls 30 and the fourth side walls 40 are respectively connected to other two opposite sides of the bottom surface 100a, and a distance between the plurality of third side walls 30 and the plurality of fourth side walls 40 gradually increases along the direction away from the bottom surface 100a.

The third side walls 30 and the fourth side walls 40 are respectively provided with a third holding portion 31 and a fourth holding portion 41. A distance between the third holding portion 31 and the fourth holding portion 41 gradually decreases along the direction away from the bottom surface 100a, and ends of the third holding portion 31 and the fourth holding portion 41 away from the bottom surface 100a extend toward the bottom surface 100a. The third holding portion 31 and the fourth holding portion 41 are used to hold opposite sides of the fixing portion 320. In one embodiment, the ends of the third holding portion 31 and the fourth holding portion 41 are substantially hook-shaped, and the third holding portion 31 and the fourth holding portion 41 are inserted into the insert slots 320a to connect to the fixing portion 320.

In one embodiment, the electromagnetic leakage prevention device 100 is made of metal, such as iron, copper, etc. The bottom surface 100a defines a plurality of holes (not labeled) for reducing weight.

It can be understood that in other embodiments, the third side walls 30 and the fourth side walls 40 may also be integrated to reduce scratching on opposite sides of the hard disk. The first holding portion 12 and the second holding portion 22 may be connected to the fixing portion 320 by other structures.

The present application also provides a case (not shown), which includes the electromagnetic leakage prevention device 100, which is fixed on the component fixing member 300 to contact the case to form an anti-radiation cavity.

The above-mentioned electromagnetic leakage prevention device 100 connects the plurality of first side walls 10 and the second side walls 20 through the first connecting portion 11 and the second connecting portion 21, so as to prevent scratching the component 200 during the insertion and removal process.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An electromagnetic leakage prevention device comprising: a bottom surface configured to be fixed to a component fixing member; a plurality of first side walls coupled to a side of the bottom surface; a plurality of second side walls coupled to a side of the bottom surface opposite the plurality of first side walls; a first connecting portion coupled to an end of the plurality of first side walls away from the bottom surface; and a second connecting portion coupled to an end of the plurality of second side walls away from the bottom surface; wherein: a distance between the plurality of first side walls and the plurality of second side walls increases along a direction away from the bottom surface; wherein the electromagnetic leakage prevention device further comprising a plurality of first holding portions and a plurality of second holding portions; wherein: the plurality of first holding portions is coupled to the first connecting portion the plurality of second holding portions is coupled to the second connecting portion; a distance between the plurality of first along the direction away from the bottom surface; and ends of the plurality of first holding portions and ends of the plurality of second holding portions extend toward the bottom surface; and wherein: the first connecting second connection section coupled in sequence; the first connecting section is coupled to the plurality of first side walls; the second connecting section is coupled to the plurality of first holding portions; and the first connecting section and the second connecting section are bent along the first arc section.

2. The electromagnetic leakage prevention device of claim 1, wherein: the second connecting portion comprises a third connecting section, a second arc section, and a fourth connecting section coupled in sequence; the third connecting section is coupled to the plurality of second side walls; the fourth connecting section is coupled to the plurality of second holding portions; and the third connecting section and the fourth connecting section are bent along the second arc section.

3. The electromagnetic leakage prevention device of claim 1, further comprising a plurality of third side walls and a plurality of fourth side walls, wherein:

the plurality of third side walls and the plurality of fourth side walls are respectively located at opposite sides of the bottom surface; and a distance between the plurality of third side walls and the plurality of fourth side walls increases along the direction away from the bottom surface.

4. The electromagnetic leakage prevention device of claim 3, further comprising a plurality of third holding portions and a plurality of fourth holding portions, wherein:

the plurality of third holding portions is coupled to the plurality of third side walls;

the plurality of fourth holding portions is coupled to the plurality of fourth side walls;

a distance between the plurality of third holding portions and the plurality of fourth holding portions decreases along the direction away from the bottom surface; and ends of the plurality of third holding portions and ends of the plurality of fourth holding portions extend toward the bottom surface.

5. A component fixing member comprising: a frame defining a receiving cavity; a fixing portion; and an electromagnetic leakage prevention device installed between the frame and the fixing portion, wherein: the electromagnetic leakage prevention device comprises a bottom surface, a plurality of first side walls, a plurality of second side walls, a first connecting portion, and a second connecting portion; the plurality of first side walls is coupled to a side of the bottom surface; the plurality of second side walls is coupled to a side of the bottom surface opposite the plurality of first side walls; the first connecting portion is coupled to an end of the plurality of first side walls away from the bottom surface; the second connecting portion is coupled to an end of the plurality of second side walls away from the bottom surface; and a distance between the plurality of first side walls and the plurality of second side walls increases along a direction away from the bottom surface, wherein: the electromagnetic leakage prevention device further comprises a plurality of first holding portions and a plurality of second holding portions; the plurality of first holding portions is coupled to the first connecting portion; the plurality of second holding portions is coupled to the second connecting portion; a distance between the plurality of first holding portions and the plurality of second holding portions decreases along the direction away from the bottom surface; and ends of the plurality of first holding portions and ends of the plurality of second holding portions extend toward the bottom surface, and wherein: the first connecting portion comprises a first connecting section, a first arc section, and a second connecting section coupled in sequence; the first connecting section is coupled to the plurality of first side walls; the second connecting section is coupled to the plurality of first holding portions; and the first connecting section and the second connecting section are bent along the first arc section.

6. The component fixing member of claim 5, wherein: the second connecting portion comprises a third connecting section, a second arc section, and a fourth connecting section coupled in sequence; the third connecting section is coupled to the plurality of second side walls; the fourth connecting section is coupled to the plurality of second holding portions; and the third connecting section and the fourth connecting section are bent along the second arc section.

7. The component fixing member of claim 6, wherein:

the electromagnetic leakage prevention device further comprises a plurality of third side walls and a plurality of fourth side walls;

the plurality of third side walls and the plurality of fourth side walls are respectively located at opposite sides of the bottom surface; and a distance between the plurality of third side walls and the plurality of fourth side walls increases along the direction away from the bottom surface.

8. The component fixing member of claim 7, wherein:

the electromagnetic leakage prevention device further comprises a plurality of third holding portions and a plurality of fourth holding portions;

the plurality of third holding portions is coupled to the plurality of third side walls;

the plurality of fourth holding portions is coupled to the plurality of fourth side walls;

a distance between the plurality of third holding portions and the plurality of fourth holding portions decreases along the direction away from the bottom surface; and ends of the plurality of third holding portions and ends of the plurality of fourth holding portions extend toward the bottom surface.

9. The component fixing member of claim 8, wherein:

one end of the frame is fixed to a side of the bottom surface facing away from the plurality of first holding portions and the plurality of second holding portions;

the fixing portion defines a plurality of insert slots;

the plurality of insert slots receives the plurality of first holding portions and the plurality of second holding portions, so as to be fixedly connected to the electromagnetic leakage prevention device;

a side of the fixing portion facing away from the electromagnetic leakage prevention device is provided with a handle rotationally installed on the fixing portion.

\* \* \* \* \*